United States Patent [19]

Young

[11] Patent Number: 4,471,472
[45] Date of Patent: Sep. 11, 1984

[54] SEMICONDUCTOR MEMORY UTILIZING AN IMPROVED REDUNDANT CIRCUITRY CONFIGURATION

[75] Inventor: Elvan S. Young, Santa Clara, Calif.

[73] Assignee: Advanced Micro Devices, Inc., Sunnyvale, Calif.

[21] Appl. No.: 345,986

[22] Filed: Feb. 5, 1982

[51] Int. Cl.³ ............................................. G11C 13/00
[52] U.S. Cl. ...................................... 365/200; 371/10
[58] Field of Search .................. 365/200, 210; 371/10, 371/11, 21

[56] References Cited

U.S. PATENT DOCUMENTS 4,228,528  10/1980  Cenker et al. ........................ 365/200
4,310,901   1/1982  Harding et al. ...................... 365/200

OTHER PUBLICATIONS

R. Sud and K. C. Hardee, "16-K Static RAM Takes New Route to High Speed", *Electronics*, Sep. 11, 1980, pp. 117-123.

V. G. McKenny, "A 5V 64K EPROM Utilizing Redundant Circuitry", 1980 *IEEE International Solid-State Circuits Conference*, Feb. 14, 1980, pp. 146-147, 270.

*Primary Examiner*—Joseph A. Popek
*Attorney, Agent, or Firm*—Patrick T. King; Gary T. Aka

[57] ABSTRACT

A redundant semiconductor memory device is arranged in columns of bit cells addressable in bit segments with a plurality of separate, redundant, columns of bit cells, each separate column being capable of electronic placement at any column position within any bit segment of the memory. Specifically, multiplexer is provided at the output buffers of a memory for multiplexing conventional bit segments with spare columns of bit cells, wherein the spare columns are only activated, that is, selected, when a particular column in the conventional bit segment has been identified to be defective.

3 Claims, 4 Drawing Figures

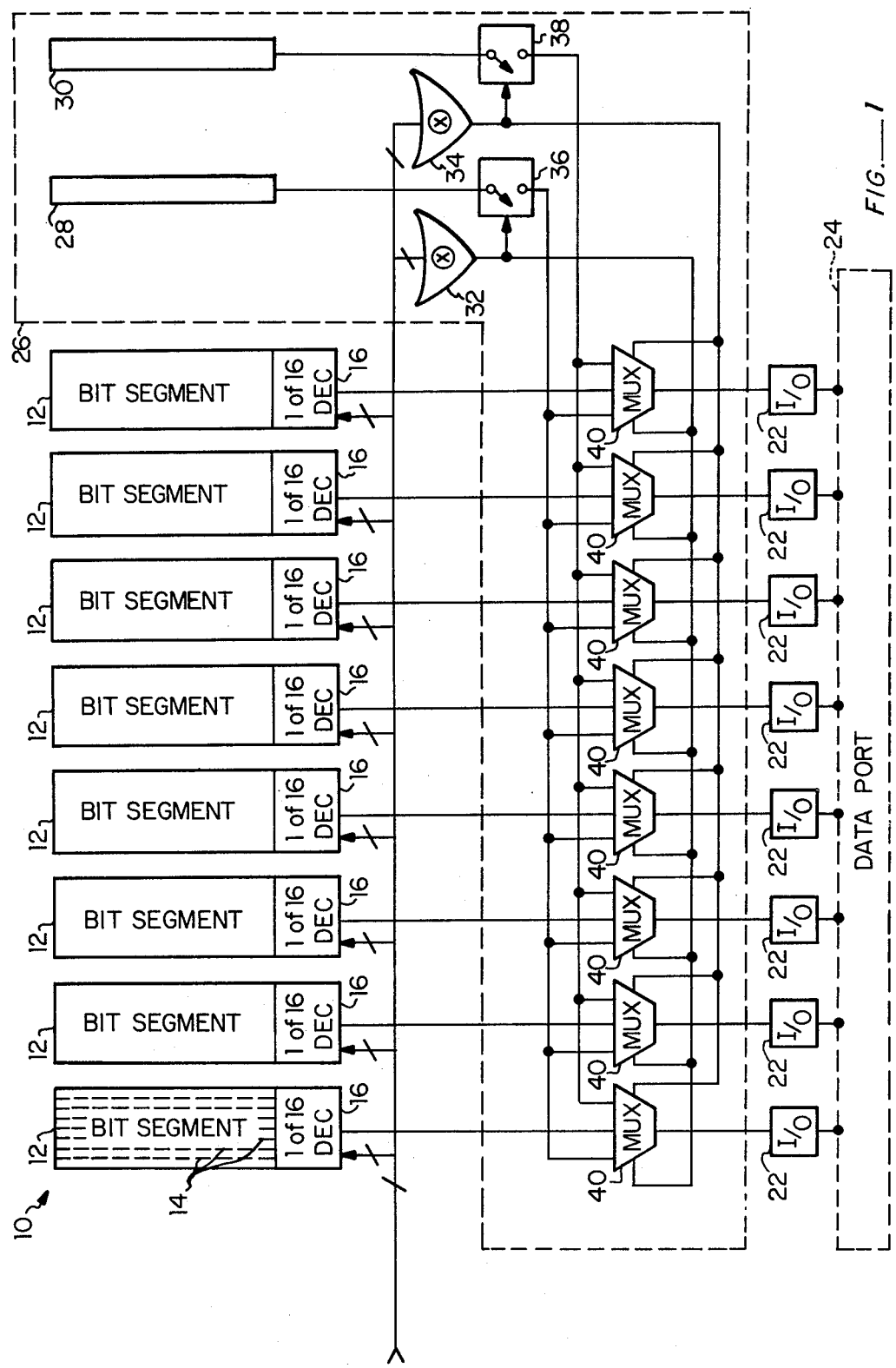

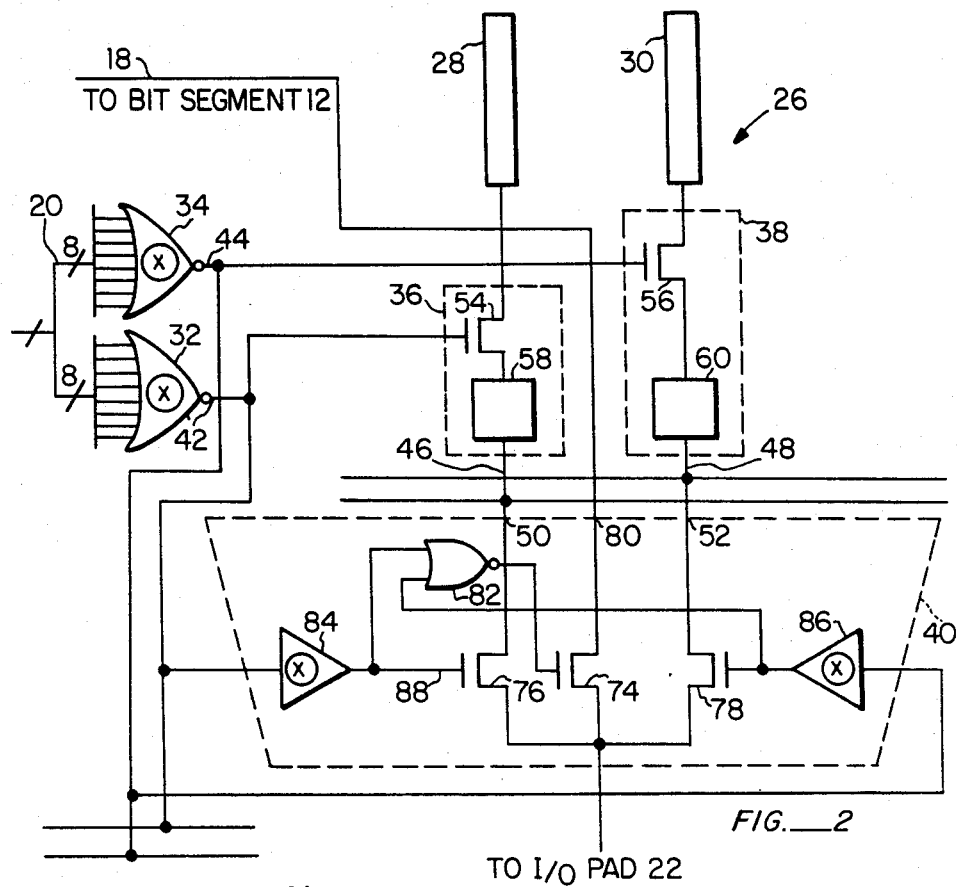
FIG._2
TO I/O PAD 22
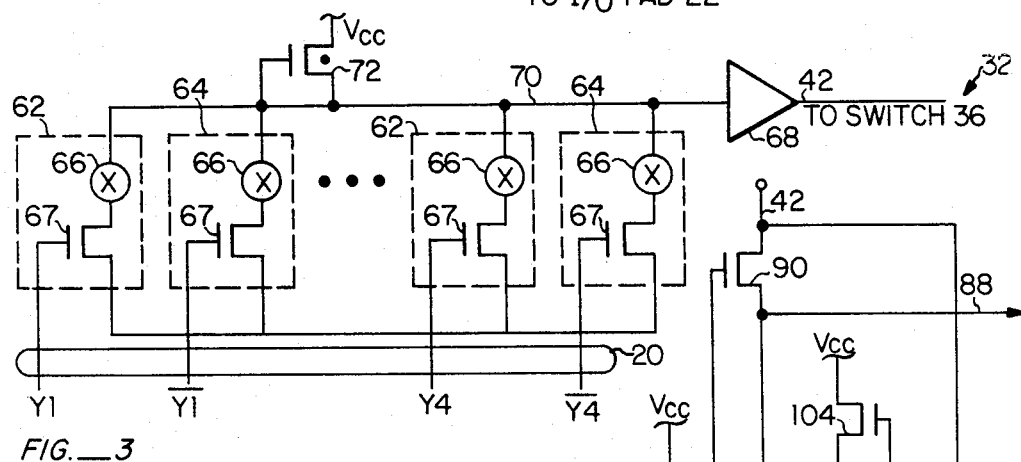
FIG._3
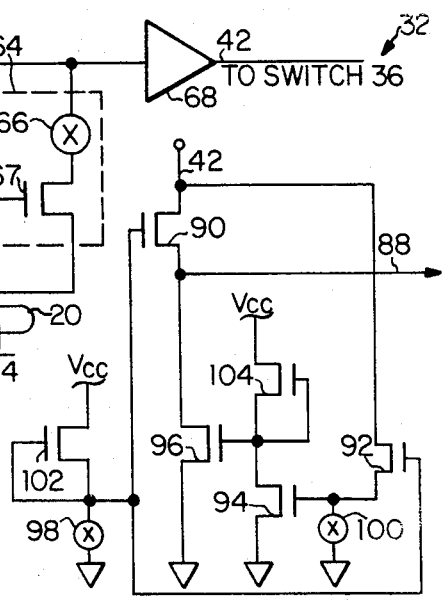
FIG._4

SEMICONDUCTOR MEMORY UTILIZING AN IMPROVED REDUNDANT CIRCUITRY CONFIGURATION

BACKGROUND OF THE INVENTION

1. Field of Invention

This invention relates to integrated circuit semiconductor memories, and particularly to a redundancy circuit scheme to compensate for any faulty column of bit cells in a byte-wide semiconductor memory array.

Process control problems associated with tight geometries in semiconductor memory arrays occasionally result in failures in bit cells of the array. The failure etiology is frequently column-related (as opposed to row-related) resulting in defective columns of bit cells.

In byte-wide semiconductor memory arrays, that is, memory arrays wherein parallel lines of output data and input data are provided in response to a single memory column address, bit cells are arranged in parallel columns forming bit segments wherein only one column of any one bit segment is addressable at any one time.

If a cell is found to be defective during manufacture, the entire semiconductor chip must either be discarded or a mechanism must be provided for substituting good bit cells for defective bit cells. Substitutable bit cells and associated circuitry are known as redundant circuit memory.

2. Description of the Prior Art

Redundancy schemes have been developed for various applications. An article entitled "A Fault-Tolerant 30ns/375mW 16K×1 NMOS Static RAM" static random access by R. Sud and K. C. Hardee, *Electronics* (Vol. 53), Sept. 11, 1980, pp. 117-123 describes one approach for bit-wide memories. This article discloses a scheme wherein a single column associated with a bit segment is provided which may be used to replace any column within a bit segment.

One semiconductor memory having byte-wide output which utilizes redundant circuitry is described in a paper entitled "A 5 V 64K EPROM Utilizing Redundant Circuitry" by Vernon G. McKenney, 1980, IEEE International Solid-State Circuits Conference Proceeding (Feb. 14, 1980). The redundant circuit scheme disclosed therein provides for the addition of an entire extra bit segment consisting of a group of columns in order to replace at least one column in only one regular bit segment.

The prior art schemes for redundant circuitry waste valuable substrate area by providing substantially more redundancy for errors than is likely to be found in a partially defective memory. What is needed is a memory with redundant circuitry of a size and layout sufficient to replace defective memory cells but not so large as to substantially increase the size of the overall memory and thereby use up space unnecessarily.

SUMMARY OF THE INVENTION

According to the invention, a redundant semiconductor memory device is arranged in columns of bit cells addressable in bit segments with a plurality of separate, redundant, columns of bit cells, each separate column being capable of electronic placement at any column position within any bit segment of the memory. Specifically, multiplexing means is provided at the output buffers of a memory for multiplexing conventional bit segments with spare columns of bit cells, wherein the spare columns are only activated, that is selected, when a particular column in the conventional bit segment has been identified to be defective.

An important element of the invention is a decoder, herein a redundant decoder, which provides a choice of activation schemes. The redundant decoder is operative to select a line of a digital address when either one of two complementary inputs are in active state. Thus, the other one of the bit inputs may be physically disabled. The redundant decoder responds to an address word by either activating the literally addressed column or by activating a substitute column and disabling the literally-addressed column. According to the invention, the redundant decoder is provided with programmable fuses, specifically, laser fusible links, by which the memory device is reformatted to bypass identified defective columns of bit cells.

The invention will be better understood by reference to the following detailed description taken in connection with the accompanying drawings.

BRIEF DESCRIPTION OF THE DRAWINGS

FIG. 1 is a block diagram of a semiconductor random access memory according to the invention.

FIG. 2 is a logic diagram of the selection circuitry according to the invention.

FIG. 3 is a circuit diagram of a redundant decoder according to the invention.

FIG. 4 is a circuit diagram of a first gate control circuit according to the invention.

DETAILED DESCRIPTION OF SPECIFIC EMBODIMENTS

Referring to FIG. 1, there is shown a portion of a semiconductor memory 10 according to the invention. Throughout the Figures, identical numbers refer to like elements. In the specific embodiment, the memory comprises eight bit segments 12 each of which comprises sixteen regular or first columns 14 of bit cells. The specific numbers of bit segments and columns per bit segment are merely illustrative for the purposes of the invention. The number of elements may vary with the size and design of the structure. In addition, the present invention deals solely with columns as opposed to row characterisitics of a semiconductor memory arranged in a matrix and generally embodied in a planar semiconductor chip. These structures are not to be confused with elements employed for row decoding. Generally different technology is required to deal with row-related defects.

Each bit segment 12 is provided with a conventional one of sixteen decoder at the base of the first columns 14. The purpose of the one of sixteen decoder is to route a selected one of the sixteen columns to a memory input/output line 18. In a byte-wide memory, eight such lines 18 form a byte-wide input/output path to the bit segments 12. A column address bus 20 is coupled to each one of the decoders 16 to provide a signal for selecting the address memory I/O line 18. Signals on the memory I/O lines 18 are coupled to input/output ports 22 which in turn are each coupled to a byte-wide data port 24.

According to the invention, redundant circuit memory 26 is disposed between the memory I/O lines 18 and the I/O ports 22 which is addressable by the column address bus 20 to selectively activate spare or second columns 28, 30 of bit cells, wherein the spare columns 28, 30 can be electrically placed at the address of any of the first columns 14 with any one of the bit segments 12. Any number of spare columns may be provided in this manner. For the purposes of illustration, only two spare columns are shown. The redundant circuit memory 26 comprises the second columns 28, 30, redundant decoders 32, 34 and column address switches 36, 38 for each spare column 28, 30 plus one multiplexer means 40 for each bit segment 12.

Turning to FIG. 2, there is shown a circuit diagram of the redundant circuit memory 26 forming selection circuitry for the memory 10 with spare columns 28, 30. The single redundant decoder output lines 42, 44 are coupled to each of the multiplexer means 40 as well as to the column address switches 36, 38 for each spare column 28, 30. The memory lines 46, 48 are each coupled to one input port 50, 52 of each multiplexer 40. For convenience, only one multiplexer means 40 is shown.

In the preferred embodiment, the memory 10 is constructed employing metal oxide semiconductor (MOS) technology with field effect transistor (FET) switches. Signal levels on the switching lines are operative in two voltage states to saturate the respective switches either on or to induce a high impedance thereby interrupting a signal path between the drain and source electrodes of the FET device.

The column address switches 36, 38 each comprise an FET switch 54, 56 having its gate electrode coupled to the respective redundant decoder output lines 42, 44 and its drain electrode coupled to the spare column 28, 30, and a bidirectional amplifier means 58, 60 coupled between the source electrode of the FET switch 54, 56 and the memory line 46, 48. Column address switches 36, 38 turn on the memory lines 46, 48 only in response to enabling signals on the redundant decoder output lines 42, 44 in response to selected column addresses applied on column address bus 20. For this purpose the redundant decoders 32, 34 are programmable, that is, they are constructed in such a manner to be selectively responsive to address signals applied to the column address bus after construction and initial testing of the memory 10. The redundant decoder 32, 34 contains for this purpose fusible links for use in constructing the response to the address signals. One such redundant decoder 32 is shown in FIG. 3. The redundant decoder 32 comprises pairs of fusible switches 62, 64, each pair of fusible switches being addressed by complementary inputs representing the column address for a 4-bit input representing sixteen different addresses. Four pairs of fusible switches 62, 64 are provided in a redundant decoder 32, according to the invention. The fusible switches each comprise a fusible link 66, such as a laser fusible conductor, and an MOS switch 67. The source electrode of each MOS switch 67 is coupled to a ground reference, and the drain electrode is coupled to one terminal of the fusible link 66. The other terminal of the fusible link is coupled to the input of a buffer amplifier 68 through an input conductor 70. The input conductor 70 is strapped to power supply $V_{cc}$ through a load, which is typically a depletion mode transistor 72. The gate electrodes of each of the FET switches 62, 64 are coupled to the complementary input address pairs, Y1, $\overline{Y1}$ through Y4, $\overline{Y4}$. The redundant decoder 32 is programmed by opening one of the pair of fusible links in each transistor pair so that output line 44 is enabled to turn on the column address switch 36 (FIG. 2) when the column address corresponding to a defective column is applied at the column address bus. One such column decoder 32 is provided for each spare column 28.

The multiplexer means 40, of which one is provided for each bit segment 12, comprises a main FET switch 74 and redundant FET switches 76, 78 having source electrodes coupled to a common node which is coupled to the I/O port 22 (FIG. 1). The drain electrode of the main FET switch 74 is coupled through multiplexer port 80 to the memory I/O line 18 of the corresponding bit segment 12. The drain electrodes of the redundant FET switches 76, 78 are coupled, respectively, to the multiplexer ports 50, 52 for the spare columns 28, 30. The gate electrode of the main FET switch 74 is coupled to the output of a NOR gate 82. The NOR gate 82 is active to turn on the main FET switch 74 only when neither one of the redundant FET switches 76, 78 are on. Thus, inputs of the NOR gate 82 are coupled to receive the same input signals as the gate electrodes of the redundant FET switches 76, 78.

The multiplexing means 40 further includes bit segment decoders 84, 86, each coupled to receive as a single input the respective outputs on output lines 42, 44 from the redundant decoders 32, 34, and having an output coupled to the gate electrodes of the respective redundant FET switches 76, 78.

Turning to FIG. 4, there is shown a bit segment decoder 84 according to the invention having as an input the redundant decoder output line 42 and an output line 88 coupled to the gate electrode of redundant FET switch 76 (FIG. 2). The object of this circuit is to provide a path for a signal applied at input line 42 to output 88 when the spare column 28 has been selected to replace a column in the bit segment 12 associated with this bit segment decoder 84. In this illustration of the invention, sixteen such bit segment decoders 84, 86 are provided; two for each multiplexer means 40. The bit segment decoder 84 comprises switching transistors 90, 92, 94, 96, fusible links 98, 100, loads 102 and 104. The load 102 is a depletion mode transistor having its drain electrode coupled to the voltage $V_{cc}$ and its drain and gate electrodes coupled to a common node with the gate electrode of transistor 90, transistor 92 and one terminal of fusible link 98. The other terminal of fusible link 98 is connected to ground. The drain electrodes of transistors 90, 92 are coupled in common to the input on signal line 42. The source electrode of transistor 90 is coupled to the output 88 and to the drain electrode of transistor 96. The source electrode of transistor 96 is connected to ground, the gate electrode of transistor 96 is connected to the load 104 and to the drain electrode of transistor 94. The source electrode of transistor 94 is connected to ground. The gate electrode of transistor 94 is connected to the source electrode of transistor 92 and to one terminal of fusible link 100. The other terminal of fusible link 100 is connected to ground. Whenever the fusible links 98, 100 are conductive, the gate electrodes of transistors 90, 92, 94 are low and therefore off. Therefore, the gate electrode of transistor 96 is high and therefore transistor 96 is on, which connects output 88 to ground. The input at line 42 appears to be an open circuit, so no signal is propagated through the bit segment decoder 84. However, when the fusible links 98, 100 are open, the gate electrodes of transistors 90, 92, 94 are high and therefore on, the gate of transistor 96 is low and therefore off, and any signal applied at input 42 is propagated to the output 88.

A defective column 14 in any bit segment 12 is programmably replaced by a spare column 28 in the following manner. The fusible links 66 of the redundant decoder 32 are opened in a pattern corresponding to the column address of the column 14 to be replaced so that the output buffer 68 is activated to turn on the switch 36 whenever the subject column address is applied to column address bus 20. The bit segment decoder 84 in the multiplexer means 40 corresponding to the selected bit segment 12 is programmed by opening the two fusible links 98, 100. The other bit segment decoder 86 in the multiplexer means 40 is not disturbed. Upon application of the selected column address signal to the column address bus 20, the redundant decoder 32 is activated to turn on the column address switch 36 and the redundant FET 76 in the multiplexer (FIG. 2). The spare column 28 is thus connected to the I/O port 22 as if it were the selected defective column.

The invention has now been explained with respect to specific embodiments. Other embodiments will be apparent to those of ordinary skill in the art. It is therefore not intended that this invention be limited except as indicated by the appended claims.

I claim:

1. In a byte-wide semiconductor memory device having a plurality of bit segments comprising first columns of memory cells for storing digital data, an improvement for providing memory cell redundancy for a limited number of bit cells in any selected ones of said bit segments, said improvement comprising:
   at least one second column of memory cells, said second column for use in replacement of any one of said first columns;
   a redundant decoder circuit means for each of said second columns, wherein said redundant decoder circuit means comprises a plurality of pairs of fusible switches, each pair of fusible switches being addressed by complementary inputs, and wherein one of each fuse of said pair is interrupted in a pattern corresponding to an address corresponding to said selected first column;
   means for each second column for activating a selected second column in response to a signal from said redundant decoder circuit means; and
   means for multiplexing any selected one of said first columns with one of said second columns in response to signals from said redundant decoder means, said redundant decoder means being responsive to a column address signal such that said second column activating means is activated when said selected one of said first columns is addressed, wherein said means for multiplexing includes a plurality of multiplexing switches including a main switch, at least one second column switch and a bit segment decoder for controlling each said column switch, and wherein each said second column switch is coupled to one of said second column of memory cells through one said second column activation means corresponding to said second column, said second column activation means being responsive to activation signals from said redundant decoder circuit means.

2. In a byte-wide semiconductor memory device having a plurality of bit segments comprising first columns of memory cells for storing binary data, an improvement for providing memory cell redundancy to substitute for a column of bit cells in any selected ones of said bit segments, said improvement comprising:
   a plurality of second columns of memory cells, said second columns of memory cells being separate from said first columns of memory cells, said second columns of memory cells each being selectively activated in response to an address signal designating any one of said first columns of memory cells of any one said bit segments;
   fusible means for selecting the address of one of said first columns;
   fusible means for selecting one of said second columns for activation in response to the address signals designating said selected first column; and
   means for multiplexing said second columns with said first columns when said selected first column is addressed in a bit segment, wherein said means for multiplexing includes a plurality of multiplexing switches including a main switch, at least one second column switch and a bit segment decoder for controlling each said second column switch, and wherein each said second column switch is coupled to one of said second column of memory cells through one said second column activation means corresponding to said second column.

3. In a byte-wide semiconductor memory device having a plurality of bit segments comprising first columns of memory cells for storing binary data, a method for substituting a limited number of second columns of bit cells for any defective first columns of bit cells, said method comprising the steps of:
   providing a limited number of second columns of bit cells separately addressable from said first columns of bit cells;
   identifying defective first columns of bit cells;
   activating one of said second columns of bit cells at an address position of said defective first columns of bit cells in response to said address signal, wherein said activating comprises selectively interrupting fusible links in a redundant decoder means for said one of said second columns, wherein said fusible links interrupting comprises opening laser fusible links in said redundant decoder means and in said bit segment decoder means; and
   bypassing said first columns of bit cells in response to address signals intended to activate said defective first columns of bit cells, wherein said bypassing includes interrupting fusible lines in a bit segment decoder means for a signal path through a means for multiplexing corresponding to said bit segment.

* * * * *